United States Patent
Deng

[19]

[11] Patent Number: 6,133,800
[45] Date of Patent: Oct. 17, 2000

[54] SUBMINIATURE MICROWAVE CAVITY

[75] Inventor: Jinquan Deng, Irvine, Calif.

[73] Assignee: Datum Inc., Irvine, Calif.

[21] Appl. No.: 09/366,113

[22] Filed: Aug. 2, 1999

[51] Int. Cl.[7] .............................. H01P 7/04; H01S 1/06; H03L 1/26

[52] U.S. Cl. ............................ 331/94.1; 331/3; 333/226; 333/232

[58] Field of Search ........................ 331/3, 94.1; 333/226, 333/232

[56] References Cited

U.S. PATENT DOCUMENTS

| | | | |
|---|---|---|---|
| 4,123,727 | 10/1978 | Peters ........................................... | 331/94 |
| 4,349,798 | 9/1982 | Podell et al. .............................. | 333/230 |
| 4,446,429 | 5/1984 | Froncisz et al. .......................... | 324/316 |
| 4,495,478 | 1/1985 | Kwon et al. ............................... | 333/230 |
| 4,633,180 | 12/1986 | Biehl et al. ................................ | 324/316 |
| 4,794,354 | 12/1988 | Dinsmore et al. ....................... | 333/226 |
| 4,947,137 | 8/1990 | Busca et al. ............................... | 331/94.1 |
| 5,192,921 | 3/1993 | Chantry et al. ............................ | 331/3 |
| 5,387,881 | 2/1995 | Schweda et al. ........................ | 331/94.1 |
| 5,627,497 | 5/1997 | Skoczen .................................... | 331/94.1 |

FOREIGN PATENT DOCUMENTS 0 330 954  9/1989  European Pat. Off. .

OTHER PUBLICATIONS

Split–ring Resonator for Use in Magnetice Resonance from 200–2000 MHz; W.N. Hardy and L.A. Whitehead, Review of Scientific Instruments, vol. 52, pp. 213–216 (1981).

The Loop–Gap Resonator: A New Microwave Lumped Circuit ESR Sample Structure; W. Froncisz and James S. Hyde; Journal of Magnetic Resonance vol. 47, pp. 515–521 (1982).

Experimental Results on a Frequency Standard Based on a Rubidium 87 Maser; Proceedings of the 39th Annual Symposium on Frequency Control; M. Tetu et al, pp. 64–71 (1985).

A Miniaturized Microwave Resonator for Rubidium Frequency Standards; G.H. Mei and J.T. Liu; Paper at Joint Meeting of Frequency and Time Forum in Besancon, France; one page, (Apr. 1999).

Coherent Microwave Emission Without Population Inversion: A New Atomic Frequency Standard; Aldo Godone, Filipo Levi and Jacques Vanier; IEEE Transaction on Instrumentation and Measurement, vol. 48, pp. 504–507 (1999).

Primary Examiner—Siegfried H. Grimm
Attorney, Agent, or Firm—Brinks Hofer Gilson & Lione

[57] ABSTRACT

An extremely small and inexpensively manufactured physics package for an atomic frequency standard can be provided with a microwave cavity having non-critical dimensions that is driven in a substantially TEM mode by a lumped LC means, the cavity resonant frequency being primarily determined by the lumped LC means. The lumped LC means can be any structure or combination of elements providing, at a selected microwave reference frequency, a resonant inductance and capacitance. Examples of such lumped LC means include, preferably, a rod or wire conductively attached to a wall of the microwave cavity as a lumped inductance and extending into the cavity to form, at its other end, a gap with an opposing cavity wall as a lumped capacitance; or a pair of rods or wires conductively attached to opposing walls and extending therefrom as a lumped inductance to form a gap therebetween as a lumped capacitance.

29 Claims, 4 Drawing Sheets

End View

Side View

SUBMINIATURE MICROWAVE CAVITY

FIELD OF INVENTION

This invention relates to quantum frequency apparatus and more particularly relates to physics packages for gas-cell atomic frequency standards, and still more particularly, to a subminiature microwave cavity for use in such systems.

BACKGROUND OF INVENTION

Modern telecommunication systems require extremely stable and accurate timing devices, with the overall size, operating temperature, power consumption, weight, and ruggedness of the device being critical parameters. Atomic frequency standards have been used in such applications.

Atomic frequency standards use natural resonances within atoms to keep time since the natural atomic resonances are more stable and less sensitive to environmental effects, such as temperature, pressure, humidity, vibration, acceleration, etc., than are macroscopic oscillators like pendulums and quartz crystals. This type of quantum mechanical atomic oscillator, operating at an atomic resonance frequency, is used as a highly stable frequency reference to which the frequency of a variable frequency oscillator, such as a quartz oscillator, can be electronically locked so the high stability and relative insensitivity to environmental perturbations of such a natural atomic resonance are transferred to the quartz oscillator. Such natural frequencies are referred to from time to time herein as "selected reference frequencies," which applies to the resonant frequencies of quantum systems. Quantum systems as used herein, means solids, liquids or gases capable of selectively absorbing or emitting microwave energy, or both, of a selected reference frequency.

The atomic frequency standards usually comprise a voltage-controlled oscillator (VCO), and a physics package and associated electronics that maintains an accurate and stable VCO standard frequency on a long-term basis. The physics package and associated electronics are used to slave the VCO to the selected reference frequency of the quantum system, thereby reducing frequency drift due to oscillator aging and the effects of the environment on the oscillator.

In an atomic frequency standard in which the quantum system comprises a passive (Rb or Cs) gas cell, the physics package includes a light source for optical pumping of the gas, a transparent gas cell situated in a microwave cavity, and a photo detector. The microwave cavity is commonly used to couple injected electromagnetic energy at about the selected reference frequency (i.e., the atomic resonance frequency) to the atomic gas, such as Rb or Cs, within the transparent cell. The microwave cavity is designed to have a microwave resonant frequency substantially equal to the atomic resonant frequency to maximize the effect of the injected electromagnetic field on the atomic gas in the cell. The injected microwave electromagnetic field is generated by frequency multiplication and synthesis from the VCO output.

In operation, the atomic gas within the transparent gas cell is optically pumped by the light from a light source. The microwave electromagnetic energy injected into the microwave cavity interacts with the atoms within the transparent cell and varies the intensity of the light transmitted through the gas cell in a manner dependent on the difference between the injected microwave frequency and the atoms' resonant frequency. The light intensity transmitted through the gas cell is sensed by the photo detector and the variation in light intensity is detected and converted by the photo detector into a physics package electrical signal output. The physics package thus provides a frequency discriminating electrical output signal dependent upon the difference between the injected microwave frequency, which has been synthesized from the VCO output, and the stable atomic resonant frequency.

Examples of other types of atomic frequency standards with microwave cavities are conventional masers [see, for example, M. Tetu, et al., "Experimental Results on a Frequency Standard Based on a Rubidium 87 Maser," Proceedings of the $39^{th}$ Annual Symposium on Frequency Control, pages 64–71 (1985)], and a new type of device described in, Aldo Godone, Filipo Levi & Jacques Vanier, "Coherent Microwave Emission Without Population Inversion: A New Atomic Frequency Standard," IEEE Transactions on Instrumentation and Measurement, Vol. 48, pages 504–507 (1999).

The microwave cavity assembly of the physics package is thus the heart of an atomic frequency standard, and substantial efforts have been directed by workers in the field to modify atomic frequency standard physics packages and cavity assemblies to improve their performance or manufacturability without deleteriously affecting their operation.

Previous cavity designs used for such applications include $TE_{011}$ and $TE_{111}$ right circular cylindrical microwave cavities. These types of cavities, especially the $TE_{011}$ cavity, have unacceptably large sizes for use in present-day telecommunications equipment. To reduce the cavity size while maintaining the resonant frequency necessary to excite the atoms in the transparent cell, prior-art designs have used a rectangular cavity. One such design is a $TE_{101}$ rectangular cavity partially loaded with a dielectric slab, described in U.S. Pat. No. 4,495,478. Another is a rectangular main cavity with two secondary cavities on opposite sides of the main cavity to produce lumped resonant loading, operating in the rectangular $TE_{021}$ mode, disclosed in U.S. Pat. No. 4,349,798. Yet another small size microwave cavity for gas-cell atomic frequency standards is a magnetron-type cavity, described in U.S. Pat. No. 5,387,881. This design uses a cylindrical envelope with four quarter-cylindrical electrodes (coaxial to the envelope) equally spaced around the transparent cell, operating in a pseudo-cylindrical $TE_{011}$ mode.

Other microwave cavities are known in the art which use lumped LC resonators and produce longitudinal microwave magnetic fields. Examples include a cavity used for hydrogen masers, as described in U.S. Pat. No. 4,123,727; a helical resonator for use in a rubidium frequency standard, as described in Euro Patent No. 0 330 954, and also in U.S. Pat. Nos. 4,947,137 and 5,192,921. Other resonators of this type are "split ring" (or "loop gap" or "slotted tube") resonators, as described in W. N. Hardy and L. A. Whitehead, Review of Scientific Instruments, Vol. 52, pages 213–216 (1981), W. Froncisz and James S. Hyde, Journal of Magnetic Resonance, Vol. 47, pages 515–521 (1982), and U.S. Pat. Nos. 4,446,429 and 4,633,180. This type of resonator has recently been used in a rubidium frequency standard (paper presented at the joint meeting of the Frequency Control Symposium and the European Frequency & Time Forum in Besancon, France in April 1999 by G. H. Mei and J. T. Liu entitled, "A Miniaturized Microwave Resonator for Rubidium Frequency Standards"). None of these lumped LC resonators operates in a substantially TEM mode.

SUMMARY OF INVENTION

The invention provides, in its preferred embodiment, an extremely small and inexpensively manufactured physics package for an atomic frequency standard with a microwave cavity having non-critical dimensions that is driven in a substantially TEM mode by a lumped LC means, the cavity resonant frequency being primarily determined by the lumped LC means. In the invention, the microwave cavity provides a substantially TEM mode, driven by the lumped LC means, for cooperation with a quantum system in the cavity.

The preferred embodiment of the invention is a modified "coaxial" cavity operating in a substantially TEM mode, with the center conductor shorted to the cavity wall at one end, and not touching the cavity wall at its other end. Conceptually speaking, the modification can be considered as if the outer conductor of a coaxial cavity is deformed to change it from a circular to a substantially rectangular cross section, and as if the center conductor is moved away from the center of the coaxial cavity in a direction perpendicular to the axis of the center conductor. In a preferred combination of the cavity and lumped LC means, the body forming the microwave cavity carries a rod that extends into and partially across the microwave cavity and the rod carries a screw threaded therethrough to permit, by turning the screw, adjustment of the lumped inductance and capacitance. The lumped LC means can be, however, any structure or combination of elements providing, at a selected microwave reference frequency, a resonant inductance and capacitance. Examples of such lumped LC means include, preferably, a rod or wire conductively attached to a wall of the microwave cavity as a lumped inductance and extending into the cavity to form, at its other end, a gap with an opposing cavity wall as a lumped capacitance; or a pair of rods or wires conductively attached to opposing walls and extending therefrom as a lumped inductance to form a gap therebetween as a lumped capacitance, or with a varactor as a lumped capacitance.

In physics packages of the invention, the microwave cavity is formed by an electrically conductive enclosure, and the microwave cavity carries a quantum system which, in preferred form, can be an atomic or molecular gas excitable at a natural resonant frequency. The electrically conductive enclosure is provided with one or more openings permitting light to be directed through the gas, which is contained in an optically transparent gas cell, and onto a photo detector, and is also provided with a lumped LC means providing a microwave resonant frequency at substantially the natural resonant frequency of the excited gas.

The photo detector can be located either inside or outside the cavity. If located inside the cavity, which is preferred, the photo detector can be carried by a cavity wall or by the rod. If located outside the cavity, some means or opening must be provided in the wall of the cavity enclosure to allow or direct light that has passed through the gas cell to impinge onto the photo detector. The preferred photo detector is a silicon photodiode within the cavity with its metallized rear surface located immediately adjacent a portion of the cavity wall.

The physics package of the invention may also contain means for producing a static magnetic field (the C-field) inside the gas cell. The preferred direction of the C-field is perpendicular to the optical axis (although the direction of the C-field is parallel to the optical axis in the conventional quantum frequency standards). The microwave magnetic field generated by the lumped LC means can have any direction, but the preferred direction inside the gas cell is perpendicular to the optical axis and parallel to the C-field because this maximizes the signal due to the (field-independent) clock transitions (which takes place between the $m_F=0$ sublevels of the two hyperfine levels).

In another embodiment, light enters the microwave cavity of the invention and interacts with a quantum system in such a way as to produce microwave energy at a selected reference frequency of the quantum system. A portion of the microwave energy is removed from the cavity by a suitable coupling device (e.g., an E-probe or a loop) and is provided to external electronics whose function is to lock the frequency of a VCO to the frequency of the microwave radiation. In this way, the VCO frequency is locked to a natural frequency of the quantum system of interest. In this type of device no photo detector is used.

Other features and advantages of the invention will be apparent from the drawings and more detailed description of presently known best mode and preferred embodiments of the invention that follows.

DETAILED DESCRIPTION OF THE INVENTION

This invention provides an extremely small and easily manufactured microwave cavity for use in apparatus in which a quantum system absorbs or emits microwave electromagnetic energy at the precise selected reference frequency of the quantum system. The quantum system can be an atomic or molecular gas, a liquid or a solid. The microwave cavity of this invention is particularly useful in atomic frequency standards in which gas cells, including atomic gases such as rubidium or cesium, are illuminated by a light source and "optically pumped" for interrogation by frequency-modulated, microwave energy at the rubidium or cesium transition frequency, stimulating transitions of the atoms between hyperfine levels with an accompanying absorption of light which may be detected to provide an electrical control output.

Figure 1:
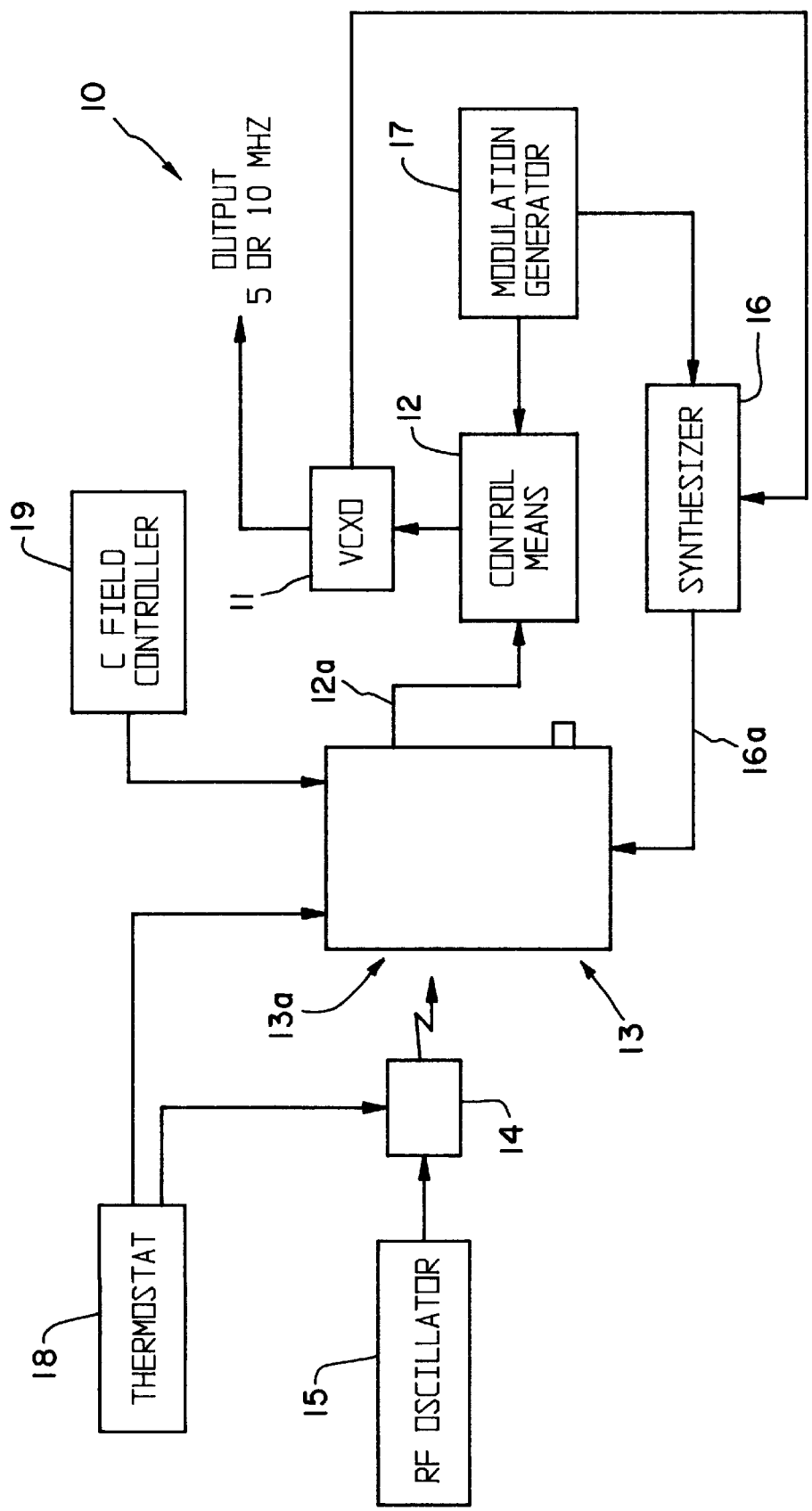
FIG. 1 is a simplified diagrammatic representation of an atomic frequency standard system in which the microwave cavity of the invention may be used.

FIG. 1 is a simplified diagram of a rubidium atomic frequency standard of the type in which a microwave cavity of this invention may be used. The components and operation of a typical rubidium atomic frequency standard are well known in the art and are therefore only briefly described herein.

As indicated in FIG. 1, such an atomic frequency standard 10 includes a physics package 13 which may advantageously include the microwave cavity of the invention, illustrated in FIGS. 2–4 and described more fully below. The atomic frequency standard 10 includes a variable frequency voltage controlled crystal oscillator VCXO 11 whose standard output frequency (e.g., 5 or 10 MHz) is controlled by a control means 12 in response to a control output signal 12a from a photo detector (not shown in FIG. 1) which is part of the physics package 13. The physics package 13 contains a transparent gas cell (not shown in FIG. 1) containing gaseous Rb-87 atoms. The atoms within the transparent gas cell are optically pumped by light source 14, which may be a rubidium vapor lamp 14 that is excited into a light producing plasma discharge by a radio frequency oscillator 15, or by a laser. The "rubidium" light is directed through a physics package aperture 13a and through the transparent gas cell to optically pump the Rb-87 atoms in the gas cell.

The atomic frequency standard 10 also includes a frequency synthesizer 16 which generates, from the standard output frequency of VCXO 11, a microwave frequency corresponding to the hyperfine transition frequency for Rb-87, i.e. 6.834 GHz, and frequency modulates the microwave energy about the hyperfine transition frequency with a modulation generator 17. The frequency modulated microwave energy is applied to the physics package 13, (as indicated at 16a) and induces transitions of the Rb-87 atoms between the hyperfine energy levels of the ground state with resultant light absorption.

When the frequency of the microwave energy corresponds to the hyperfine transition frequency, maximum light absorption occurs and the current output of the photo detector is reduced. If, however, the frequency of the microwave energy does not correspond to the hyperfine transition energy, then more light will pass through the gas cell to the photo detector, which in turn increases its current output. Since the current output in the control signal 12a is at a minimum when the microwave energy 16a is at the hyperfine frequency, and the current in the output photo detector 12a is greater when the microwave input 16a is less than or greater than the hyperfine transition frequency, the control signal 12a is used by the control means 12 to lock the standard frequency output of VCXO 11 to the hyperfine transition frequency of the Rb-87 gas in the gas cell of physics package 13.

In the typical atomic frequency standard 10 of FIG. 1, a thermostat 18 is used to stabilize the temperatures of the light source 14 and the physics package 13 in an effort to avoid the effects of temperature variation. In addition, a C-field current controller circuit 19 is typically employed to provide a static magnetic field, known in the art as the "C-field", to magnetically bias the atomic gas in the gas cell and separate the Zeeman levels of the atomic hyperfine states.

As indicated above, the means forming a resonant microwave cavity of the invention comprises an electrically conductive cavity-forming means having non-critical dimensions and a lumped LC means in the cavity to, primarily, provide its microwave resonance. A preferred microwave cavity of the invention is illustrated in FIGS. 2, 3A and 3B, and an alternate embodiment of such a cavity is illustrated in FIG. 4.

Figure 2:
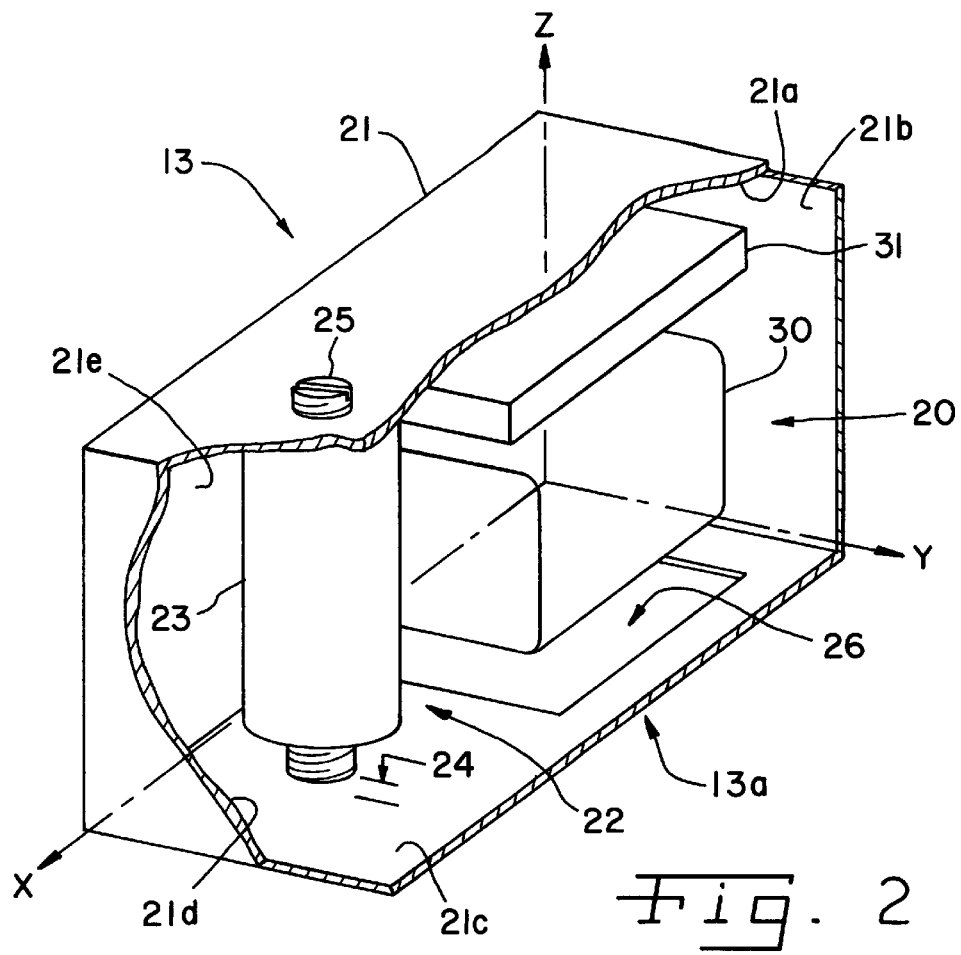
FIG. 2 is a perspective view of a microwave cavity of the invention, partially broken away to illustrate its interior.
Figure 3A:
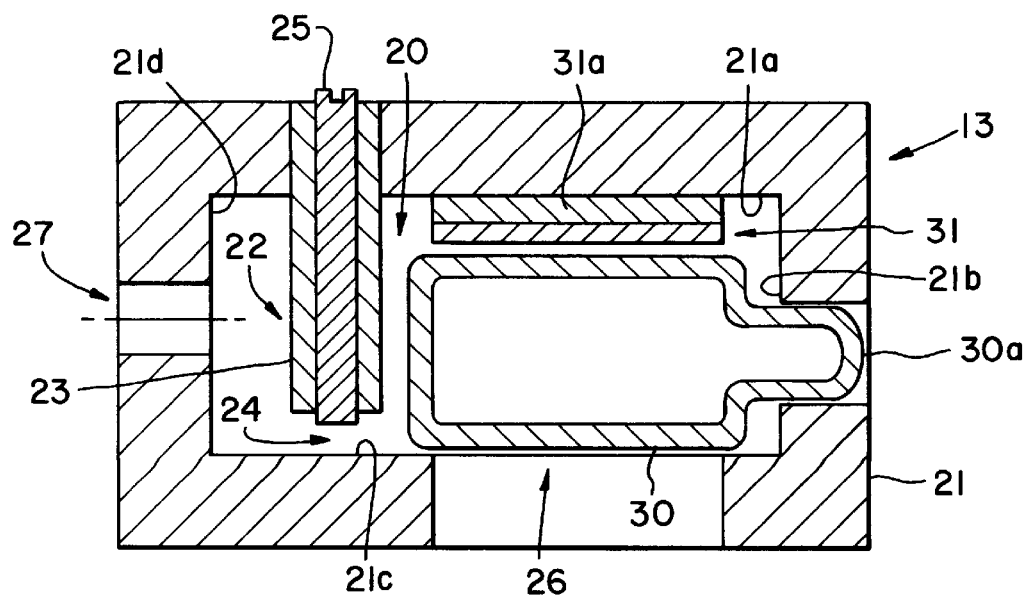
FIG. 3A is a cross sectional view of the microwave cavity of FIG. 2 taken at a plane parallel to the XZ plane in FIG. 2.
Figure 3B:
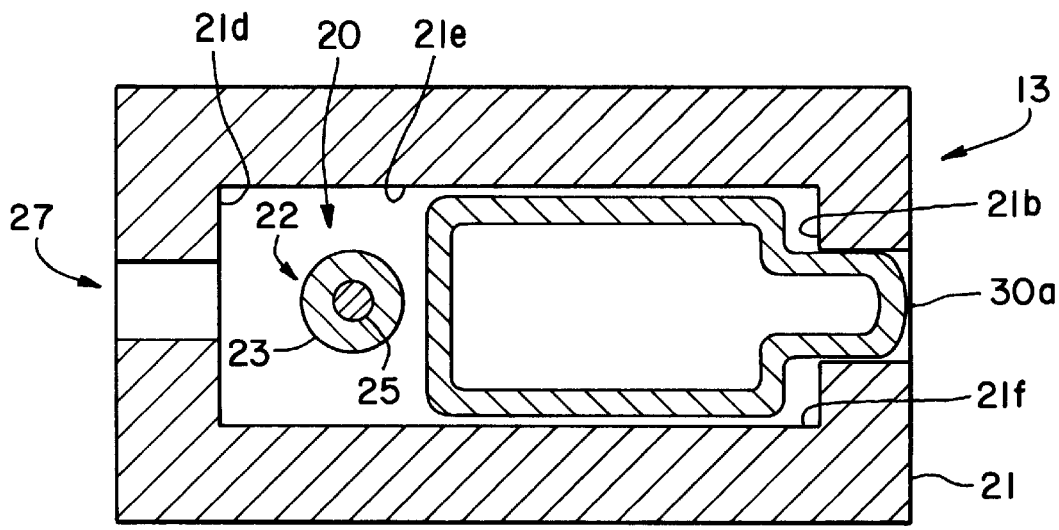
FIG. 3B is a cross sectional view from above the microwave cavity of FIG. 2 taken at a plane parallel to the XY plane in FIG. 2.

In the illustrative embodiment of FIGS. 2 and 3, a resonant cavity 20 is formed by an electrically conductive enclosure 21 that provides the electrically conductive cavity walls. In the embodiment shown in FIGS. 2, 3A and 3B, the electrically conductive means 21 forms the walls of the microwave cavity 20 in a form of the right parallelepiped. The cavity walls which are not cut away in FIG. 2 have been provided element numbers 21a–21e, wall 21f having been cut away to illustrate the interior of the microwave cavity 20. As indicated above, the dimensions of the walls 21a–21f are not critical in the invention as resonant frequency of the microwave cavity is determined primarily by the lumped LC means 22.

The lumped LC means 22 in the preferred embodiment illustrated in FIGS. 2, 3A and 3B comprises an electrically conductive rod 23 connected at one end to wall 21a of the electrically conductive means 21 and extending partially across the cavity in the direction of wall 21c and forming, between its distal end and wall 21c, a gap indicated by the space numbered 24 in FIGS. 2 and 3A. The electrically conductive rod 23 may be threaded and carried by a threaded hole in the enclosure 21 to permit adjustment of the gap 24, or as in the embodiment illustrated in FIGS. 2, 3A and 3B lumped LC means 22 is provided with a second electrically conductive rod 25 adjustably carried by rod 23 to permit adjustment of the gap 24. In the embodiment illustrated in FIGS. 2, 3A and 3B, the adjustable electrically conductive rod 25 may be a screw, or screw portion, threadedly carried by rod 23 so that upon turning of the screw 25 the gap between its end and wall 21c of the electrically conductive means 21 may be adjusted.

In the invention, the resonant frequency of a microwave cavity 20 is determined primarily by the inductance and capacitance provided by the lumped LC means 22 within the cavity. As will be apparent to those skilled in the art, the inductance of the lumped LC means will be determined by the dimensions of rod 23, primarily its length and diameter, and the capacitance will be determined primarily by the diameters of rods 23 and 25, and the length of the gap 24. In the illustrated embodiments of FIGS. 2–4, the resonance presented by the lumped LC means and its inductance and capacitance can be varied by adjustment of the threaded electrically conductive element 25.

The preferred form 20 of microwave cavity and lumped LC means is the modified coaxial cavity operating in a substantially TEM mode, with the center conductor (23) shorted to the cavity walls (21a) at one end and not touching the cavity walls (21c) at the other end. Such a modification permits a microwave cavity carrying a transparent gas cell 30 at the end of the cavity opposite the lumped LC means 22, as illustrated in FIGS. 2–4, while retaining the very desirable characteristic of having non-critical dimensions and operating in a substantially TEM mode.

It is helpful to visualize this cavity as being formed by the steps below.

Figure 5A:
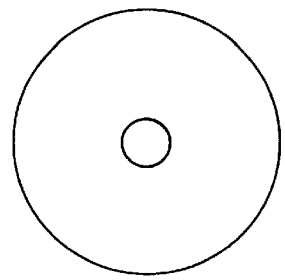
FIGS. 5A–5D are diagrams presented as an aid to visualization of the TEM mode of operation of the invention.
Figure 5A:
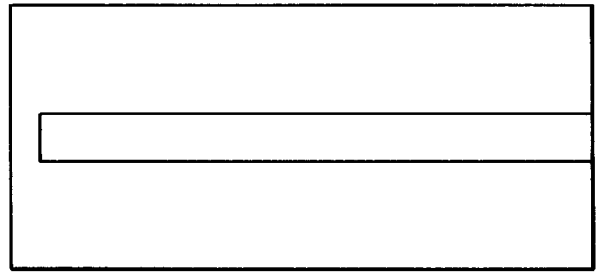

1. The visualization starts with a length of coaxial cable with air dielectric that is closed at both ends to form a cavity. In this configuration, the center conductor of the cable is shorted to the shield at one end, and terminated in a gap (capacitance) at the other end, as shown in FIG. 5A. This device operates substantially in the TEM mode (the usual mode for a coaxial cables), except at the ends where there are some non-transverse fringing field components that cause a slight departure from pure TEM behavior.

Figure 5B:
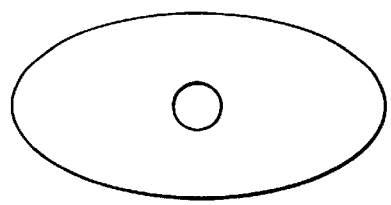
Figure 5C:
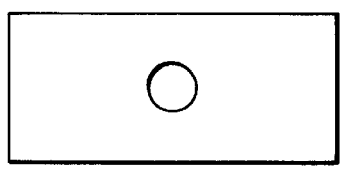

2. The next step is to deform the outer shield of the resulting cavity by "squeezing" it, as shown in FIG. 5B. This device still operates in a substantially TEM mode. The deformation can be such as to produce a rectangular cross section of the outer conductor of the cavity, as shown in FIG. 5C.

3. The final step is to translate the center conductor of the cavity toward the outer shield in a direction perpendicular to the axis of the center conductor.

Figure 5D:
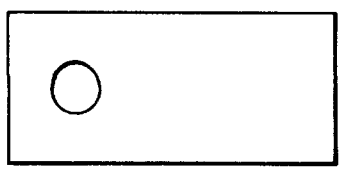

This results in the preferred form of the cavity, shown in FIG. 5D, which still operates in a substantially TEM mode.

Figure 4:
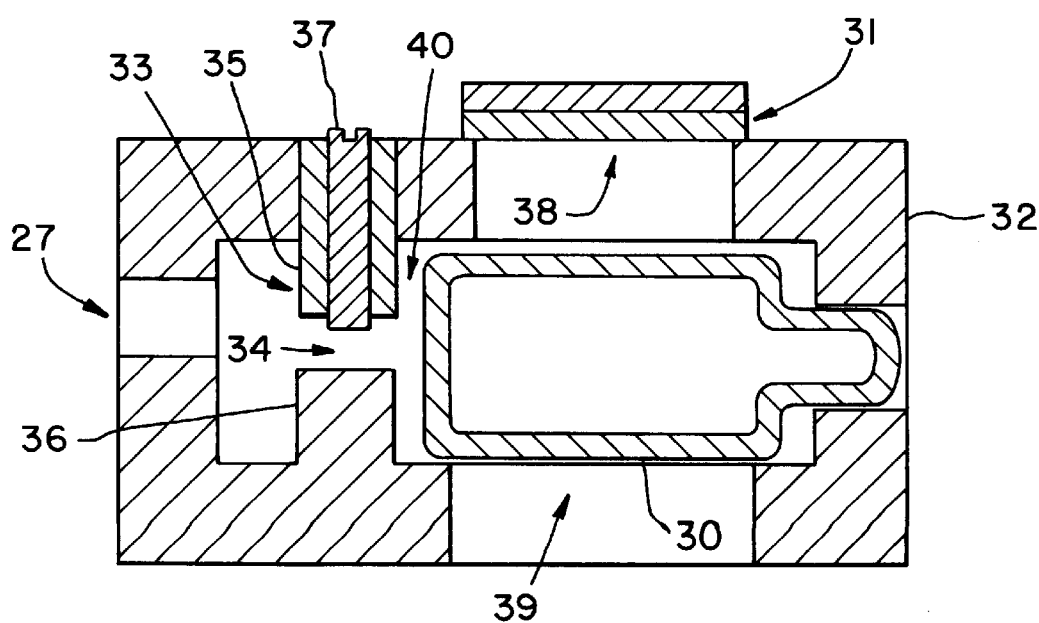
FIG. 4 is a cross sectional view of another embodiment of the microwave cavity of the invention taken at a plane parallel to the XZ plane of the microwave cavity (which corresponds in the illustrated embodiment to the X and Z axes illustrated in FIG. 2)

As further illustrated in FIGS. 2, 3A and 4, the microwave cavity 20 can contain and carry a photo detector 31 at one side of the optically transparent gas cell 30 and the electrically conductive enclosure means 21 is further provided with an opening or aperture 26 formed on an optical axis which includes the transparent gas cell 30 and photo detector 31. The optical axis lies generally parallel to the Z-axis as illustrated in FIG. 2.

The magnetic field components of the injected microwave energy lie generally in planes parallel to the plane including the X and Y axes. The microwave magnetic field passes through gas cell 30 in a direction substantially perpendicular to the light, which is generally in the direction of the Z axis. In addition, the microwave magnetic field can be made more uniform in the region where the gas is being interrogated than is the case for conventional TE-mode cavities, thereby tending to reduce the microwave power sensitivity. In addition, the invention provides a small cavity having a highly loaded Q of 300 to 400, thereby reducing the amount of microwave power required for satisfactory operation.

The microwave cavity 20 of this invention may be provided with static magnetic C-field by a C-field coil (not shown) which can be provided inside the cavity, or outside the electrically conductive enclosure 21 if the electrically conductive means 21 is formed by a non-magnetic electrically conductive material. It is strongly preferred that the C-field coil (or other means providing the static magnetic field) provides a static magnetic field parallel with the microwave magnetic field, that is with static magnetic lines lying generally in planes parallel to the plane including the X and Y axes, so that the microwave magnetic field and static magnetic fields are in planes substantially perpendicular to the optical axis (Z axis). In such an arrangement, the plane of the light hole will be substantially parallel to the direction of the C-field which is very unusual for small atomic standards. Such an arrangement will improve the efficiency of optical pumping of the gas in the gas cell and the short term frequency stability of the atomic frequency standard. Those skilled in the art will be able to provide C-field means as described above.

Another advantage of having the C-field parallel to the plane of the light hole 26 and substantially perpendicular to the optical axis is that it improves the magnetic shielding of the resonance gas cell 30. Since the reference frequency of the atoms in the gas cell 30 is sensitive to external magnetic fields (via the Zeeman effect), the gas cell 30 must be surrounded by a magnetic shield. The shield can be either the cavity itself (made out of some material such as mu metal), as taught in U.S. Pat. No. 4,661,782, or a separate shield enclosing only the cavity or a shield enclosing both the light source and the cavity. The shield usually contains an aperture on the optical axis so that light can pass from the light source through the gas cell. Unfortunately, unwanted flux lines (from magnetic fields outside the physics package) can enter the gas cell through the light hole in the shield. In the conventional configuration, where the C-field is parallel to the optical axis, these flux lines will tend to add algebraically to the C-field. In the present invention, where the C-field is perpendicular to the optical axis, these flux lines will tend to be at right angles to the C-field, thereby adding in quadrature and producing only a second-order effect compared to the conventional case.

Even the components of flux leakage that are parallel to the C-field in the present invention will tend to produce a second-order effect. This occurs because these components tend to be symmetrical with respect to the optical axis thereby increasing the field on one side and decreasing it on the other side. Thus, atoms on one side of the optical axis have their frequencies shifted up and atoms on the other side have their frequencies shifted down. The net result, to the first order, is a broadening rather than a shifting of the composite atomic line (which has contributions from all the atoms in the cell); i.e., to first order there is again no frequency shift of the atomic line.

FIGS. 3A and 3B are orthogonal views of the physics package illustrated in FIG. 2, FIG. 3A being a cross-sectional view taken at a plane parallel to the XZ plane of FIG. 2 and FIG. 3B being a cross-sectional view taken at a plane parallel to the XY plane of FIG. 2. As further illustrated by FIGS. 3A and 3B, the electrically conductive enclosure 21 of the microwave cavity may have an opening formed in its end 21b to accept a tip-off portion 30a of gas cell 30. FIG. 3A further illustrates the light opening 26 formed in wall 21c and its location to admit light through the transparent gas cell 30 along an optical axis or axes, including the photo detector 31. FIG. 3A further illustrates that the metallized rear surface 31a of a preferred photo detector 31, such as a silicon photodiode, may be located immediately adjacent and fastened to a portion of wall 21a of the microwave cavity. FIG. 3A further illustrates the gap 24 which is adjustable by the threaded screw 25. In some embodiments of this invention a varactor may be located in gap 24 to substantially provide an electrically tunable lumped capacitance of the lumped LC means 22, in which case the threaded rod 25 is not needed.

FIGS. 3A, 3B and 4 also illustrate that an opening 27 may be provided in wall 21d of the enclosure means 21 to admit means for the injection or extraction of microwave magnetic energy into or from the microwave cavity 20. Such a microwave energy coupling means may be an E-field probe (or an H-field loop) from a microwave frequency synthesizer, diagrammatically shown in FIG. 1 as element 16, or other microwave means known in the art.

FIG. 4 illustrates another form of microwave cavity 40 of this invention. The microwave cavity 40 of FIG. 4 differs from the microwave cavity of FIGS. 2, 3A and 3B by the form of the lumped LC means 33. In the embodiment illustrated in FIG. 4, the gap 34, which comprises primarily the lumped capacitance of the lumped LC means 33, is formed by the gap 34 between the end of rod 36 and rods 35 and 37. As in the embodiment illustrated in FIGS. 2, 3A and 3B, rod 35 may be provided with a second electrically conductive rod 37 adjustably carried by rod 35 to permit adjustment of the gap 34, and the adjustable electrically conductive rod 37 may be a screw or screw portion to permit adjustment of the gap 34 by turning of the screw or screw portion 37. In addition, in some embodiments, a varactor may be placed between the rods 35–36 to act primarily as an electrically tunable lumped capacitance of lumped LC means 33. Another difference in the embodiment illustrated in FIG. 4 is that photo conductor 31 is located outside the electrically conductive enclosure means 32 and the electrically conductive enclosure means 32 is provided with a pair of openings 38 and 39 permitting light to be transmitted through the electrically conductive means 32 and transparent gas cell 30.

The electrically conductive enclosure means 21 and 32 are illustrated diagrammatically in the drawings. Although the drawings illustrate the microwave cavity 20, 40 formed as a right parallelepiped, the cavity 20, 40 may have other forms. The enclosure means 21 may be formed with any suitable electrically conductive material, such as zinc or aluminum, and because of the non-criticality of the invention may be formed by such manufacturing methods as extrusion, stamping, casting and the like. An accurate machining of the cavity to maintain critical dimensions is not necessary in the invention.

In addition, the microwave cavity 20, 40 may be formed from one or more pieces connected together to form the electrically conductive enclosure 21, 32. The lumped LC means may be one or more rods of electrically conductive material that are shorted, i.e., connected, at one end to the walls of the electrically conductive enclosure means 21, 32 or may be provided by a length of wire adjustably carried within the microwave cavity.

The electrically conductive enclosure means 21 and 32 preferably used in the invention include a five-sided enclosure and a flat lid (e.g., the side of the enclosure that has been completely removed in FIG. 2 to allow the interior of the enclosure to be seen). The flat lid can be stamped out of thin copper or aluminum sheet. The five-sided enclosure can be milled out of conductive material such as aluminum, copper, or brass, or it can be die cast zinc. The lid can be fastened to the rest of the enclosure using solder or silverfilled epoxy adhesive. The rods 23, 25, 35 and 37 may be fabricated out of brass using a screw machine. The rods 23 and 35 can be fabricated with an external thread by which it can be screwed into a mating threaded hole in the enclosure 21, 32. The parts can be plated with gold or some equivalent material that provides a highly reflective surface at the wavelength of the pumping light (780 and 795 nm for Rb-87 atoms) and which prevents significant deterioration of the reflectance over the life time of the standard, at the operating temperature of the cavity.

As described above, the invention provides means forming a microwave cavity usable in an atomic frequency standard or other quantum frequency apparatus comprising an electrically conductive cavity forming an enclosure, having one or more light openings at one end that provide an optical axis for light into or through the cavity, and having a tuning rod extending into the cavity adjacent the other end in a direction that is substantially parallel to the optical axis and providing, with a wall of the electrically conductive closure, a lumped inductance and capacitance resonant at a selected reference frequency so that the cavity and rod cooperate at the selected reference frequency to operate the cavity in a substantially TEM mode with its microwave magnetic field substantially perpendicular to the optical axis between the rod and the far end of the conductive cavity.

As an example of the small size achievable with this invention, the illustrative embodiment of FIGS. 2, 3A and 3B can be made for a rubidium atomic frequency standard with the following dimensions:

The length of the cavity enclosure, i.e., the length of walls 21a, 21c, 21e and 21f=0.574 inches.

The width of the cavity enclosure, i.e., the width of walls 21a and 21c=0.300 inches.

The height of the cavity enclosure, i.e., the height of walls 21e and 21f=0.355 inches.

The diameter of rod 23=0.125 inches.

The length of rod 23=0.330 inches.

The length of gap 24=0.025 inches

The length of gas cell 30, excluding the tip off portion 30a=0.475 inches.

The width and the height of the glass cell 30=0.260 inches

The length of aperture 26=0.400 inches.

The width of aperture 26=0.200 inches.

The invention can also be incorporated into masers of the type described in, for example, M. Tetu, et al., "Experimental Results on a Frequency Standard Based on a Rubidium 87 Maser," Proceedings of the 39$^{th}$ Annual Symposium on Frequency Control, pages 64–71 (1985), and into a new type of device described in, Aldo Godone, Filipo Levi & Jacques Vanier, "Coherent Microwave Emission Without Population Inversion: A New Atomic Frequency Standard," IEEE Transactions on instrumentation and Measurement, Vol. 48, pages 504–507 (1999). In such embodiments of the invention, light enters the microwave cavity 20, 40 of the invention and interacts with a quantum system carried within the microwave cavity 20, 40 in such a way as to produce microwave energy at a selected reference frequency of the quantum system. A portion of the microwave energy is removed from the cavity 20, 40 by a suitable coupling device (e.g., an E-probe or a loop inserted in opening 27) and is provided to external electronics whose function is to lock the frequency of a VCO to the frequency of the microwave radiation. In this way, the VCO frequency is locked to a natural frequency of the quantum system of interest. In this type of device, no photo detector is required.

Embodiments and modifications other than the presently preferred embodiments described above may be made without departing from the scope of the invention as defined in the claims that follow. The invention is applicable to apparatus other than atomic frequency standards in which a resonant microwave field cooperates with an excitable medium having multiple energy states that is excitable by an additional electromagnetic energy source, such as light.

I claim:

1. A microwave cavity comprising:
   an electrically conductive means forming a microwave cavity;
   a quantum system carried within the microwave cavity, said microwave cavity being operable at about a selected reference frequency of the quantum system;
   means for admission of light into the microwave cavity and quantum system; and
   lumped LC means for operation of the microwave cavity in a substantially TEM mode and resonant, when excited by microwave energy at about the selected reference frequency, to provide a microwave field in the microwave cavity.

2. The microwave cavity assembly of claim 1 wherein the lumped LC means comprises an electrically conductive tuning rod carried by said electrically conductive means extending into the cavity and forming a gap within the cavity.

3. The microwave cavity assembly of claim 2 wherein the tuning rod comprises an electrically conductive rod adjustably carrying a second conductive element for adjustment of the inductance and capacitance.

4. The microwave cavity assembly of claim 3 wherein the electrically conductive rod has a substantially round cross section and the second conductive element is threadedly engaged with the electrically conductive rod to permit adjustment of the gap.

5. The microwave cavity assembly of claim 2 wherein means for admission of light forms an optical axis including the quantum system, and the tuning rod has a central axis substantially parallel to said optical axis.

6. The microwave cavity assembly of claim 2 wherein the tuning rod comprises two rod portions, each of the rod portions extending from opposing sides of the cavity with a gap therebetween.

7. The microwave cavity assembly of claim 1 wherein the quantum system is an atomic gas contained in an optically transparent gas cell.

8. The microwave cavity assembly of claim 7 further comprising means for providing a static magnetic field in the gas cell.

9. The microwave cavity assembly of claim 8 wherein the static magnetic field means provides a static magnetic field substantially parallel to the microwave magnetic field in the gas cell.

10. The microwave cavity assembly of claim 1 further comprising means for providing a static magnetic field in the quantum system.

11. The microwave cavity assembly of claim 10 wherein the microwave cavity is in the form of a right parallelepiped.

12. The microwave cavity assembly of claim 11 wherein the means for admission of light comprises a planar aperture in the microwave cavity and the plane of the aperture for admission of light is substantially parallel to the direction of the static magnetic field in the quantum system.

13. The microwave cavity assembly of claim 10 wherein the means for admission of light forms an optical axis including the quantum system, and the microwave field provides a microwave magnetic field substantially perpendicular to the optical axis in the quantum system.

14. The microwave cavity assembly of claim 7 further comprising a photo detector carried by the microwave cavity on an optical axis including the optically transparent gas cell.

15. The microwave cavity assembly of claim 14 wherein the microwave cavity is in the form of a right parallelepiped, and wherein the photo detector comprises a silicon photo diode located within the microwave cavity on the optical axis, said silicon photo diode having a metallized rear surface immediately adjacent one wall of the microwave cavity.

16. Means forming a microwave cavity for a quantum frequency standard, comprising an electrically conductive cavity-forming enclosure having an opening in one side of the cavity forming an optical axis through the cavity adjacent one end thereof, and having a rod extending into the cavity adjacent the other end thereof in a direction substantially parallel to said optical axis, and providing, with the electrically conductive enclosure, a lumped LC resonant at a selected reference frequency;

said cavity and rod cooperating at the selected reference frequency to operate the microwave cavity in a substantially TEM mode and to provide a microwave magnetic field substantially perpendicular to said optical axis and between said rod and said one end.

17. The means of claim 16 including a photo detector carried by said enclosure on the optical axis.

18. The means of claim 17 wherein the photo detector is carried outside of said enclosure.

19. The means of claim 16 wherein the electrically conductive cavity-forming enclosure carries means forming a static magnetic C-field portion that is substantially parallel to the microwave magnetic field formed by the tuning rod within the cavity.

20. The means of claim 16 further comprising a quantum system carried by said means on the optical axis.

21. A microwave cavity for an atomic frequency standard, comprising:

an electrically conductive means forming a microwave cavity operable at about an atomic gas reference frequency;

an optically transparent atomic cell carried within and at one end of the cavity and providing an atomic gas excitable at the atomic gas reference frequency;

means for providing a static magnetic field in the optically transparent atomic cell;

an aperture for admission of light formed in the electrically conductive means on an optical axis including the optically transparent atomic cell; and lumped LC means for operating said microwave cavity in a substantially TEM mode and resonant, when excited by microwave energy at about the atomic gas reference frequency, to provide a microwave magnetic field in the optically transparent atomic cell substantially parallel to the static magnetic field, said microwave magnetic field being substantially perpendicular to the optical axis.

22. The microwave cavity of claim 21 including a photo detector carried within said microwave cavity adjacent one side of the optically transparent cell and lying on the optical axis.

23. The microwave cavity of claim 21 wherein the lumped LC means comprises an electrically conductive rod carried by said electrically conductive means extending into the cavity and forming a gap within the cavity.

24. The microwave cavity of claim 23 wherein the electrically conductive rod comprises an electrically conductive rod adjustably carrying a second conductive element for adjustment of the inductance and capacitance.

25. The microwave cavity of claim 24 wherein the electrically conductive rod has a substantially round cross section and the second conductive element is threadedly engaged with the electrically conductive rod to permit adjustment of the gap.

26. The microwave cavity of claim 23 wherein the electrically conductive rod has a central axis substantially parallel to said optical axis.

27. The microwave cavity of claim 23 wherein the electrically conductive rod comprises two rod portions, each of the rod portions extending from opposing sides of the cavity with a gap there between.

28. The microwave cavity of claim 21 wherein the plane of the aperture for admission of light is parallel to the direction of the static magnetic field in the atomic cell.

29. The microwave cavity of claim 21 wherein the atomic gas is rubidium or cesium vapor.

* * * * *